United States Patent
Slocum et al.

(10) Patent No.: US 8,003,954 B2
(45) Date of Patent: Aug. 23, 2011

(54) GAS DELIVERY SYSTEM FOR AN ION SOURCE

(75) Inventors: John Slocum, Medford, MA (US);
Kevin M. Keen, Medford, MA (US);
Chris Campbell, Newburyport, MA (US); Robert Lindberg, Rockport, MA (US); Stefan Casey, Clifton Park, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 266 days.

(21) Appl. No.: 12/339,221

(22) Filed: Dec. 19, 2008

(65) Prior Publication Data
US 2009/0289197 A1 Nov. 26, 2009

Related U.S. Application Data

(60) Provisional application No. 61/018,690, filed on Jan. 3, 2008.

(51) Int. Cl.
*H01J 37/08* (2006.01)
(52) U.S. Cl. ............... 250/423 R; 250/425; 250/492.21
(58) Field of Classification Search ............... 250/423 R
See application file for complete search history.

(56) References Cited

U.S. PATENT DOCUMENTS

| | | | | |
|---|---|---|---|---|
| 2,597,307 A | * | 5/1952 | Elkind | 215/220 |
| 5,137,780 A | * | 8/1992 | Nichols et al. | 428/336 |
| 5,188,705 A | * | 2/1993 | Swanson et al. | 204/192.34 |
| 5,522,932 A | * | 6/1996 | Wong et al. | 118/715 |
| 6,452,338 B1 | | 9/2002 | Horsky | |
| 6,593,580 B2 | * | 7/2003 | Miyabayashi | 250/425 |
| 6,627,901 B2 | | 9/2003 | Martinez | |
| 6,744,214 B2 | | 6/2004 | Horsky et al. | |
| 7,022,999 B2 | | 4/2006 | Horsky et al. | |
| 7,107,929 B2 | | 9/2006 | Horsky et al. | |
| 7,112,804 B2 | | 9/2006 | Horsky et al. | |
| 7,185,602 B2 | | 3/2007 | Horsky et al. | |
| 2003/0030010 A1 | | 2/2003 | Perel | |
| 2008/0105828 A1 | | 5/2008 | Hatem et al. | |
| 2008/0169427 A1 | | 7/2008 | Hatem et al. | |

FOREIGN PATENT DOCUMENTS
JP 2000311619 A 11/2000
* cited by examiner

*Primary Examiner* — Phillip A Johnston

(57) ABSTRACT

An ion source has an arc chamber with an electron-emitting element and a repeller. A manifold assembly defines a cavity and a gas outlet configured to allow gas flow to the arc chamber. This gas outlet is closer to the repeller than the electron-emitting element. In one embodiment, the ion source has a first crucible and a second crucible. The first crucible and the second crucible are connected to the manifold assembly. In one instance, the crucibles have tamper-resistant features.

8 Claims, 5 Drawing Sheets

GAS DELIVERY SYSTEM FOR AN ION SOURCE

CROSS-REFERENCE TO RELATED APPLICATIONS

This application claims priority to the provisional patent application entitled "Carborane Delivery System," filed Jan. 3, 2008 and assigned U.S. App. No. 61/018,690, the disclosure of which is hereby incorporated by reference.

FIELD

This disclosure relates to ion sources, and more particularly to an ion source for large molecular compounds.

BACKGROUND

Ion implantation is a standard technique for introducing conductivity-altering impurities into workpieces, such as semiconductor wafers. A desired impurity material is ionized in an ion source of an ion implanter, the ions are accelerated to form an ion beam of prescribed energy, and the ion beam is directed at the surface of the workpiece. The energetic ions in the beam penetrate into the bulk of the semiconductor material and are embedded into the crystalline lattice of the semiconductor material in the workpiece to form a region of desired conductivity.

An ion source is a critical component of an ion implanter. The ion source is required to generate a stable, well-defined ion beam for a variety of different ion species and extraction voltages. Electrons generated by the ion source will ionize a dopant gas to produce a plasma. This plasma may be formed into the ion beam used for implantation.

Large molecular compounds have been previously used in ion implanters. Carborane $C_2B_{10}H_{12}$ is one example of a large molecular compound that may be used in ion implantation. Implantation of large molecular ions allows the equivalent of a high current, low energy atomic dopant ion implant with reduced energy contamination. Large molecules, such as $C_2B_{10}H_{12}$, may have multiple dopant atoms per molecule. To obtain a specific dose, fewer large molecules are required than dopant atoms because each molecule may have multiple dopant atoms. Thus, for large molecules the dose or beam current may be reduced to attain a similar dose of dopant atoms or the dose may be increased at a particular beam current compared to that beam current of dopant atoms. Large molecule ions may obtain a similar depth as a dopant atom ion with higher energy due to the large molecule's size. This larger size may prevent channeling, or implantation substantially between the atoms of the crystal lattice of the workpiece. Thus, the beam energy may be increased for large molecule ions compared to dopant atom ions to obtain a similar implant depth. These higher beam energies reduce energy contamination in the beam and may limit the space-charge effect.

$C_2B_{10}H_{12}$ and other large molecules present particular design challenges in an ion source. First, a large time between refills of a crucible, or recharge interval, in the ion source is desirable. $C_2B_{10}H_{12}$ and other large molecules require a large reservoir of powder that is vaporized or sublimed to produce the vapor used in the ion source. A standard-sized crucible may not hold enough material to operate for long periods of time between recharges. Second, wall reactions may occur when material from the crucible condenses on a contacted surface. A material, such as $C_2B_{10}H_{12}$ or another large molecule, may condense on non-heated surfaces. This condensation may lead to clogging or buildup on surfaces within the gas delivery system or the arc chamber. Third, pyrolysis may occur in an ion source. Pyrolysis is the decomposition of a compound or molecule by heating. Organic substances are one example of a compound or molecule that may decompose due to pyrolysis. The heat within a standard ion source may cause large molecules, such as $C_2B_{10}H_{12}$, to break up or decompose. Lastly, it is difficult to switch species or have two crucibles with two different species operating in one ion source. In many designs, heat from operating one crucible to vaporize one species, such as arsenic, also may unintentionally vaporize the $C_2B_{10}H_{12}$ or other large molecules in another crucible.

Accordingly, there is a need for a apparatus for ionization of large molecules in an ion implanter which overcomes the above-described inadequacies and shortcomings.

SUMMARY

According to a first aspect of the invention, an ion source is provided. The ion source comprises an arc chamber and a manifold assembly. The arc chamber has an electron-emitting element and a repeller. The manifold assembly defines a cavity and a gas outlet, the gas outlet configured to allow gas flow to the arc chamber. The gas outlet is closer to the repeller than the electron-emitting element.

According to a second aspect of the invention, a method is provided. The method comprises providing an arc chamber with an electron-emitting element and a repeller and providing a gas outlet configured to allow gas flow to the arc chamber. A gas is flowed into the arc chamber closer to the repeller than the electron-emitting element. The gas is ionized in the arc chamber.

According to a third aspect of the invention, a crucible is provided. The crucible comprises a canister defining a cavity. A crucible cap is connected to the canister, the crucible cap defining an aperture and at least one hole. A nozzle is disposed in the aperture of the crucible cap, the nozzle having a rim inside the cavity disposed on the crucible cap configured to prevent the nozzle from being withdrawn through the aperture. At least one pin is disposed in the hole of the crucible cap, the pin configured to secure the crucible cap to the canister.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
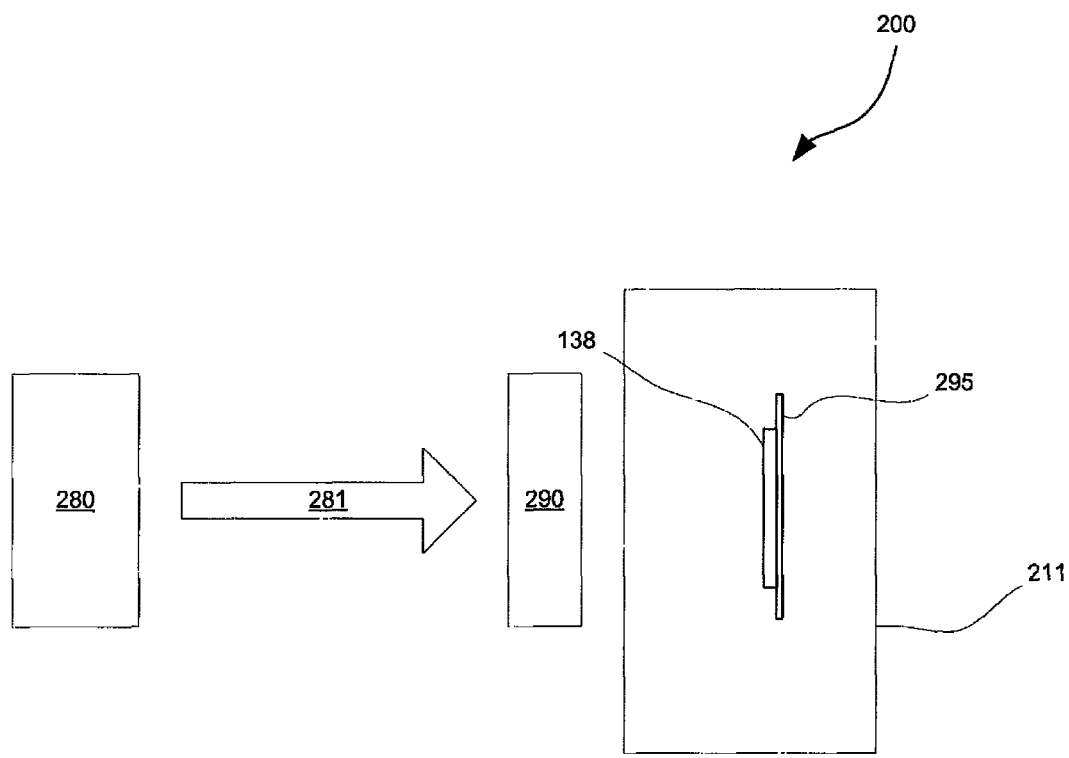
FIG. 1 is a simplified block diagram of a beam-line ion implanter.

FIG. 1 is a simplified block diagram of a beam-line ion implanter. Those skilled in the art will recognize that the beamline ion implanter 200 is only one of many examples of differing beamline ion implanters. Embodiments of this apparatus also may be applicable to other ion implantation systems or other workpiece or semiconductor wafer processing equipment. In general, the beamline ion implanter 200 includes an ion source 280 to generate ions that are extracted to form an ion beam 281, which may be, for example, a ribbon beam or a spot beam. The ion beam 281 may be mass analyzed and converted from a diverging ion beam to a ribbon ion beam with substantially parallel ion trajectories in one instance. The beamline ion implanter 200 may further include an acceleration or deceleration unit 290 in some embodiments.

An end station 211 supports one or more workpieces, such as workpiece 138, in the path of the ion beam 281 such that ions of the desired species are implanted into workpiece 138. In one instance, the workpiece 138 may be a semiconductor wafer having a disk shape, such as, in one embodiment, a 300 mm diameter silicon wafer. However, the workpiece 138 is not limited to a silicon wafer. The workpiece 138 could also be, for example, a flat panel, solar, or polymer substrate. The end station 211 may include a platen 295 to support the workpiece 138. The end station 211 also may include a scanner (not shown) for moving the workpiece 138 perpendicular to the long dimension of the ion beam 281 cross-section, thereby distributing ions over the entire surface of workpiece 138.

The ion implanter 200 may include additional components known to those skilled in the art such as automated workpiece handling equipment, Faraday sensors, or an electron flood gun. It will be understood to those skilled in the art that the entire path traversed by the ion beam is evacuated during ion implantation. The beamline ion implanter 200 may incorporate hot or cold implantation of ions in some embodiments.

Figure 2:
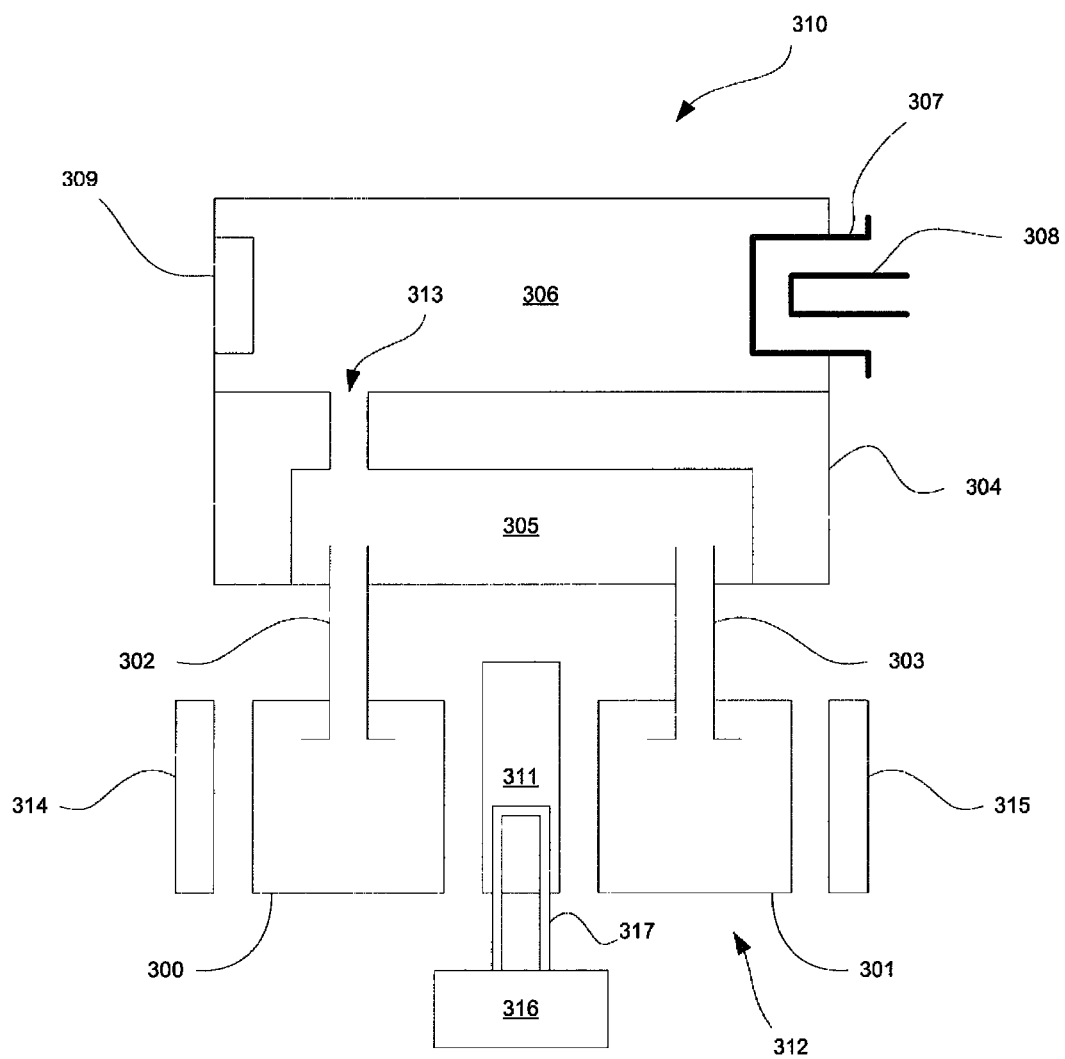
FIG. 2 is cross-sectional view of an embodiment of an ion source for use in an ion implanter.

FIG. 2 is cross-sectional view of an embodiment of an ion source for use in an ion implanter. Ion source 310, which may correspond to or be part of the ion source 280 of FIG. 1 in one particular embodiment, includes a vaporizer assembly 312. The vaporizer assembly 312 includes at least two crucibles: first crucible 300 and second crucible 301. In other embodiments, one crucible or more than two crucibles are included. These crucibles are configured to vaporize or sublime large molecules, such as $C_2B_{10}H_{12}$, into a vapor. In another instance, these crucibles also may be configured to vaporize or sublime other compounds such as, for example, boron-containing, arsenic-containing, or phosphorus-containing compounds. This vaporization may be performed by heating the crucibles with tungsten filament lamps 314, 315. The tungsten filament lamps 314, 315 in one instance operate at approximately 500 W to heat the first crucible 300 and second crucible 301. In this particular embodiment, the lamps 314, 315 are positioned near the side of the first crucible 300 and second crucible 301, but other locations, such as below the first crucible 300 and second crucible 301, are possible. Other heating methods known to those skilled in the art, such as a resistive coil heater, also may be used. The crucibles 300, 301 vary in size as is known to those skilled in the art and each may have its temperature monitored with a temperature probe.

The first crucible 300 includes a nozzle 302 and the second crucible 301 includes a nozzle 303. Both the nozzle 302 and nozzle 303 lead to the cavity 305 of the manifold assembly 304. The cavity 305 may be considered a manifold in one instance. The first crucible 300 and second crucible 301 may be coupled to the manifold assembly 304 using the nozzle 302 and nozzle 303. In other embodiments, the first crucible 300 and second crucible 301 may be screwed or otherwise disposed onto other parts of vaporizer assembly 312. In one particular instance, the nozzle 302 and nozzle 303 slide into the manifold assembly 304. A close fit or low clearance between the nozzle 302 or nozzle 303 and the manifold assembly 304 may reduce leakage and allow heat transfer from the arc chamber 306 or the manifold assembly 304 to the nozzle 302, nozzle 303, first crucible 300, or second crucible 301. This heat transfer may, for example, heat the nozzle 302 or nozzle 303 such that condensation of a vapor is prevented or reduced. This may prevent or reduce clogging of the nozzle 302 or nozzle 303 with any condensed vapor.

A pressure difference between the first crucible 300 and second crucible 301 and the arc chamber 306 means that vapor may only flow to the arc chamber 306. The arc chamber 306 may be at a lower pressure than the crucibles 300, 301. This design of the ion source 310 where material will flow into the arc chamber 306 due to the pressure difference is configured to prevent leakage from the crucibles 300 and 301 and, in turn, prevents material from the crucibles 300 and 301 from condensing on any contacted surface. Thus, any condensation on walls within the manifold assembly 304 or nozzles 302, 303 that form difficult-to-clean deposits are minimized.

The manifold assembly 304 allows either the first crucible 300 or the second crucible 301 to operate individually. The manifold assembly 304 also allows both the first crucible 300 and the second crucible 301 to operate together. In an embodiment where $C_2B_{10}H_{12}$ or another large molecule is used in both the first crucible 300 and the second crucible 301, this doubles the total available charge to the ion source 310.

The manifold assembly 304 has a gas outlet 313 that is linked with an arc chamber 306. The arc chamber 306 has an electron-emitting element. The electron-emitting element in this particular embodiment is an indirectly heated cathode 307 with a filament 308 and a repeller 309. In operation, the filament 308 will heat the indirectly heated cathode 307. The indirectly heated cathode 307 emits electrons into the arc chamber 306 which are at least partly repelled by the repeller 309. Large molecules, such as $C_2B_{10}H_{12}$, or other arsenic-containing compounds, phosphorus-containing compounds, boron-containing compounds, or other compounds are ionized within the arc chamber 306 using these electrons. Other electron-emitting elements, such as filaments or Bernas sources may be used in other embodiments. Other ion sources, such as microwave, electron gun, or other ion sources known to those skilled in the art, also may be used in other embodiments. In yet another embodiment, two or more different plasma generating sources ("dual mode") are linked within the arc chamber 306 to ionize the various compounds. One particular instance may include, for example, an indirectly heated cathode and a microwave ion source.

The gas outlet 313 of the manifold assembly 304 directs the vapor from the first crucible 300 or second crucible 301 to a region of the arc chamber 306 farther from the electron-emitting element than the repeller 309. This reduces the occurrence of pyrolysis of the vapor in the arc chamber 306. Pyrolysis is the decomposition of a compound or molecule by heating, such as an organic molecule.

In this particular embodiment, the gas outlet 313 is disposed closer to the repeller 309 than the indirectly heated cathode 307. In one particular embodiment, the gas outlet 313 is located approximately 2.5 inches from the indirectly heated cathode 307. In another particular embodiment, the gas outlet 313 is located approximately 0.89 inches from the repeller 309 and approximately 2.71 inches from the indirectly heated cathode 307. In yet another particular embodiment, the gas outlet 313 is located approximately 25% the distance between the repeller 309 and the indirectly heated cathode 307 with the gas outlet 313 closer to the repeller 309 than the indirectly heated cathode 307. In other embodiments, the gas outlet 313 is located less than approximately 2.5 inches from said repeller or less than approximately 1 inch from said repeller.

$C_2B_{10}H_{12}$, which is merely one example of a large molecule, will break up at approximately 700° C. The indirectly heated cathode 307 may operate as high as approximately 2000° C. Therefore, moving the gas outlet 313 away from the indirectly heated cathode 307 reduces pyrolysis of $C_2B_{10}H_{12}$.

The manifold assembly 304 contacts the arc chamber 306 in this embodiment, which will allow heat transfer from the arc chamber 306 to the manifold assembly 304. This will prevent the vapor in the cavity 305 of the manifold assembly 304 from cooling and condensing on surfaces of the manifold assembly 304. Preventing this condensation may prevent clogging or buildups within the manifold assembly 304. The manifold assembly 304 may have insulation in one embodiment to at least partly limit the amount of heat transfer to the manifold assembly 304 from the arc chamber 306.

A cooled separator wall 311 may be disposed between the first crucible 300 and the second crucible 301. The cooled separator wall 311 defines a fluid passage 317. This fluid passage 317 allows passage of a fluid, such as water, supplied by the cooling mechanism 316. The fluid will allow the temperature of the cooled separator wall 311 to be controlled. The cooling mechanism 316 may be part of a cooling system for an ion implanter 200 in one instance.

This cooled separator wall 311 is configured to allow one of the two crucibles to run at a vaporization temperature during certain times while preventing heat transfer to the other crucible or keeping the other crucible at a lower temperature. Thus, in this instance only one of the two crucibles will vaporize any material located within it. The cooled separator wall 311 also prevents "cross-talk" between the two crucibles. By preventing "cross-talk," material in one crucible at a lower temperature is not vaporized into the cavity 305 due to the operation of the other crucible at the higher temperature.

The cooled separator wall 311 may allow one of the crucibles 300, 301 to vaporize or sublime a large molecule, such as $C_2B_{10}H_{12}$. In this instance, only one of the crucibles may be operating at a time. The cooled separator wall 311 prevents the large molecule in the one crucible from being vaporized or sublimed by the operation of the other crucible.

The cooled separator wall 311 also may be used to allow different implant species to be used. For example, in one embodiment $C_2B_{10}H_{12}$ is located in the first crucible 300 while an arsenic-containing compound is located in the second crucible 301. The cooled separator wall 311 allows for the operation of the second crucible 301 without unintentionally vaporizing the $C_2B_{10}H_{12}$ in the first crucible 300.

In an alternate embodiment, the manifold assembly 304 is connected to gas sources rather than crucibles 300, 301. Thus, the ion source 310 is not merely limited to vaporization or sublimation of a material in a crucible and may operate by flowing at least one gas into the manifold assembly 304.

Figure 3:
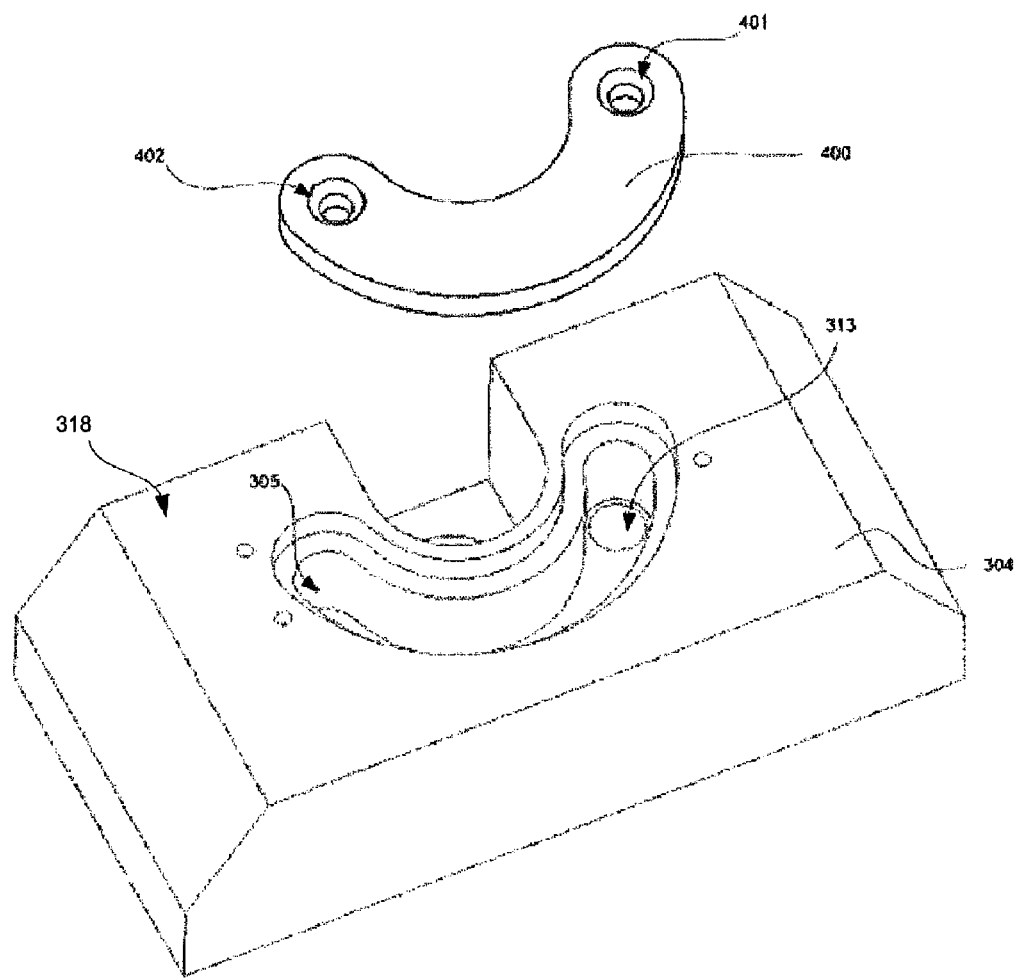
FIG. 3 is an exploded perspective view of one side of an embodiment of a manifold for use in the vaporizer assembly of FIG. 2.

FIG. 3 is an exploded perspective view of one side of an embodiment of a manifold for use in the vaporizer assembly of FIG. 2. The surface 318 faces the crucibles 300, 301 of FIG. 2. The manifold insert 400 is disposed on the manifold assembly 304 and at least partially covers the cavity 305. Again, the manifold assembly 304 includes a single gas outlet 313. The manifold insert 400 in this particular embodiment is removable from the manifold assembly 304. This manifold insert 400 further includes nozzle holes 401 and 402 in this embodiment. More or fewer nozzle holes may be included in the manifold insert 400. The nozzle holes 401 and 402 are configured to be disposed closely with any nozzles, such as nozzle 302 and nozzle 303 of FIG. 2. This close fitting helps prevent backflow or leakage of vaporized material as it leaves the nozzles 302, 303. In one particular embodiment, the manifold insert 400 has nozzle holes 401 and 402 that are configured to be necked down or to have a varying diameter along the length of the nozzle holes 401, 402. This may help prevent backflow.

Figure 4:
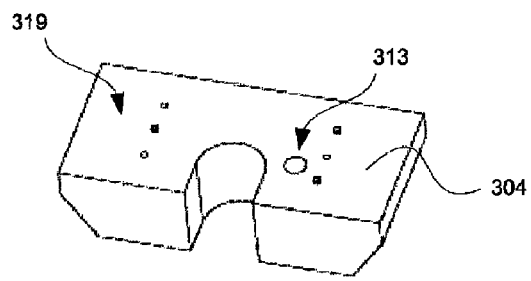
FIG. 4 is a perspective view of the other side of an embodiment of a manifold for use in the vaporizer assembly of FIG. 2.

FIG. 4 is a perspective view of the other side of an embodiment of a manifold for use in the vaporizer assembly of FIG. 2. The surface 319 faces the arc chamber 306 of FIG. 2. As seen in FIG. 4, the manifold assembly 304 is configured in a manner consistent with FIG. 2. While the manifold assembly 304 allows materials vaporized within multiple crucibles to be transported through cavity 305, it includes a single gas outlet 313.

Figure 5:
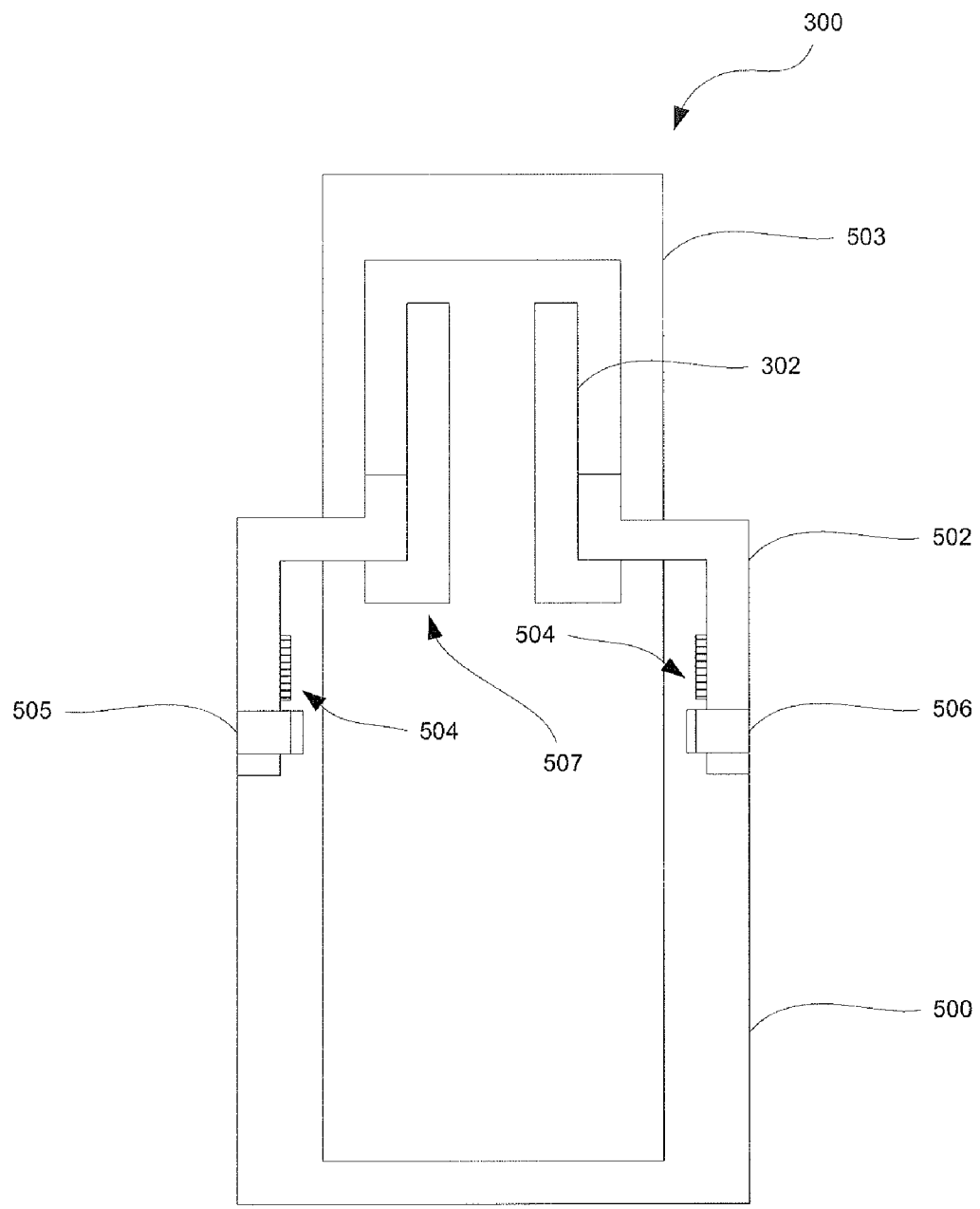
FIG. 5 is a cross-sectional view of a first embodiment of a crucible with tamper-resistant features.

FIG. 5 is a cross-sectional view of a first embodiment of a crucible with tamper-resistant features. The crucible 300 includes a canister 500 with threaded portion 504 around the circumference of the canister 500. A crucible cap 502 may be screwed onto this threaded portion 504 of the canister 500. However, any method known to a person skilled in the art that disposes the crucible cap 502 on the canister 500 may be used. Thus, the crucible 300 is not limited solely to use of the threaded portion 504. The canister 500 and crucible cap 502 may be, for example, graphite. This canister 500 is configured to hold $C_2B_{10}H_{12}$ or other large molecules, for example, but may also hold other compounds or species known to those skilled in the all.

A nozzle 302 is inserted into the crucible cap 502. This nozzle 302 may be, for example, tungsten or stainless steel. In one instance, the nozzle 302 is screwed into the crucible cap 502. The nozzle 302 is flanged at the bottom to form a rim 507 that prevents removal of the nozzle 302 from the crucible cap 502. The nozzle 302 may only be removed through screwing or pushing the nozzle 302 into the canister 500 or by breaking the crucible cap 502 or nozzle 302. Thus, removal of the nozzle 302 is prevented.

A shipping cap 503 is disposed on top of the crucible 300. The shipping cap 503 may be screwed onto, snapped onto, or otherwise disposed on the canister 500 or crucible cap 502. Any method that connects the shipping cap 503 to the canister 500 or crucible cap 502 known to those skilled in the art may be used. This shipping cap 503 may be removed before insertion into any ion source, such as ion source 310 of FIG. 2.

The crucible 300 further includes two pins 505 and 506. In one instance, the pins 505 and 506 are stainless steel. These pins are inserted through the crucible cap 502 into the canister 500 of the crucible 300. In this particular embodiment, the pins 505 and 506 are located under the threaded portion 504, but the pins 505 and 506 may be placed elsewhere in the crucible cap in other embodiments as is known to those skilled in the art. Other embodiments may use more or less than two pins and the crucible 300 is not solely limited to having two pins. The pins 505 and 506 may be separate from and inserted through the crucible cap 502 or may be assembled as part of the crucible cap 502 to be pushed into the canister 500 to make it tamper-resistant.

The pins 505 and 506 are configured to lock the crucible cap 502 on the canister 500. The pins 505 and 506 in some embodiments are configured to be permanently affixed within the crucible cap 502 and the canister 500. While a user may be able to unscrew the crucible cap 502 to a certain extent in some embodiments, the crucible cap 502 cannot be fully removed from the canister 500 without breaking the crucible cap 502 and/or canister 500 due to the presence of the pins 505 and 506. This makes the crucible cap 502 resistant to tampering and may assure the quality of the compound within the crucible 300.

Figure 6:
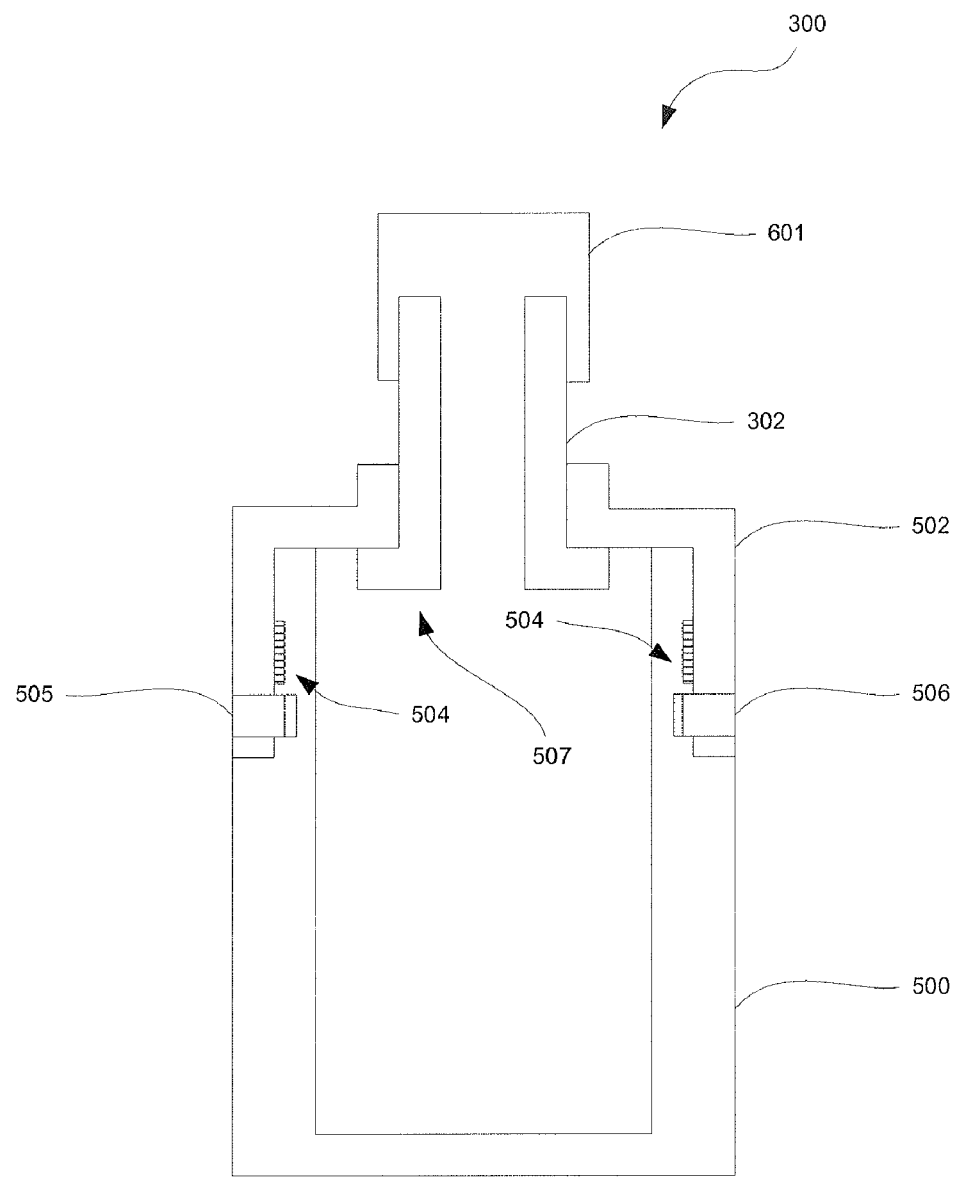
FIG. 6 is a cross-sectional view of a second embodiment of a crucible with tamper-resistant features.

FIG. 6 is a cross-sectional view of a second embodiment of a crucible with tamper-resistant features. This particular embodiment does not include a shipping cap 503. Instead, a plug 601 is disposed on the top of the nozzle 302. In some embodiments, the plug 601 may be rubber, vinyl, or a polymer and may be slipped on and off the nozzle 302.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A crucible comprising:
   a canister defining a cavity, said canister having an interior surface facing said cavity and an exterior surface opposite said interior surface;
   a crucible cap connected to said exterior surface of said canister, said crucible cap defining an aperture and at least one hole;
   a nozzle disposed in said aperture of said crucible cap, said nozzle having a rim inside said cavity disposed on said crucible cap configured to prevent said nozzle from being withdrawn through said aperture; and
   at least one pin disposed in said hole of said crucible cap, said pin configured to secure said crucible cap to said canister.

2. The crucible of claim 1, wherein said crucible further comprises a plug disposed on said nozzle opposite said rim, said plug composed of vinyl.

3. The crucible of claim 1, wherein said crucible further comprises a shipping cap disposed over said nozzle.

4. The crucible of claim 1, wherein said nozzle is selected from the group consisting of tungsten and stainless steel.

5. The crucible of claim 1, wherein said pin is stainless steel.

6. The crucible of claim 1, wherein said crucible cap has threads for engagement with said canister.

7. The crucible of claim 1, wherein said nozzle has threads for engagement with said crucible cap.

8. The crucible of claim 1, wherein said crucible cap is disposed on said exterior surface of said canister and wherein said pin is disposed in said hole passing through said crucible cap into said canister.

* * * * *